US007021367B2

(12) United States Patent
Oikawa (10) Patent No.: US 7,021,367 B2
(45) Date of Patent: Apr. 4, 2006

(54) LIQUID COOLING JACKET

(75) Inventor: Hironori Oikawa, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/796,045

(22) Filed: Mar. 10, 2004

(65) Prior Publication Data

US 2005/0077028 A1    Apr. 14, 2005

(30) Foreign Application Priority Data

Oct. 8, 2003    (JP)    ............................. 2003-349701

(51) Int. Cl.
*F28F 7/00*    (2006.01)
(52) U.S. Cl. ..................... 165/80.4; 165/185
(58) Field of Classification Search ............... 165/80.4, 165/80.5, 104.21, 104.33, 185
See application file for complete search history.

(56) References Cited

U.S. PATENT DOCUMENTS

| 4,188,996 | A  | * | 2/1980 | Pellant et al. ............... 165/80.4 |
| 4,592,415 | A  | * | 6/1986 | Friedman .................... 165/80.5 |
| 6,089,222 | A  | * | 7/2000 | Ban et al. .................... 126/247 |
| 6,167,948 | B1 | * | 1/2001 | Thomas ....................... 165/185 |
| 6,707,676 | B1 | * | 3/2004 | Geva et al. ................... 165/185 |
| 6,712,128 | B1 | * | 3/2004 | Dussinger et al. ........... 165/185 |
| 6,796,370 | B1 | * | 9/2004 | Doll ............................ 165/80.4 |
| 2001/0018967 | A1 | * | 9/2001 | Uead et al. .................. 165/185 |
| 2001/0037875 | A1 | * | 11/2001 | Guerrero .................... 165/104.33 |
| 2002/0088609 | A1 | * | 7/2002 | Tantoush .................... 165/104.33 |
| 2005/0082043 | A1 | * | 4/2005 | Sarraf ......................... 165/104.33 |

FOREIGN PATENT DOCUMENTS

| JP | 2000-340727 | 12/2000 |
| JP | 2002-170915 | 6/2002 |
| TW | 509349 | 11/2002 |

* cited by examiner

*Primary Examiner*—Teresa J. Walberg
(74) *Attorney, Agent, or Firm*—Mattingly, Stanger, Malur & Brundidge, P.C.

(57) ABSTRACT

In a liquid cooling jacket, to improve the heat transfer coefficient, extensibility and assembling, the liquid cooling jacket comprises a base bonded to a heating element; a post standing perpendicularly to the base; a plurality of radiating fins attached to the post and arranged so as to be parallel to the base; a partition filling up intervals between the plurality of radiating fins at a predetermined width; and a case which surrounds the post and the radiating fins and is bonded to the base, and to which an inlet and an outlet for coolant are attached at positions where flow of the coolant is divided by the partition. The plurality of radiating fins may be arranged at intervals each of which is narrow in comparison with a thickness of each of the plurality of radiating fins. Therefore, because the coolant flow within the liquid cooling jacket ensures a plurality of passages, the passage resistance is low. In addition, by setting the size of each of the inlet and outlet for the coolant to be substantially equal to the height of the arranged radiating fins, the flow rates on the radiating fins can be even.

15 Claims, 11 Drawing Sheets

PRIOR ART

FIG.19

PRIOR ART

FIG.20

PRIOR ART

FIG.21

PRIOR ART

LIQUID COOLING JACKET

CROSS REFERENCE TO RELATED APPLICATION

This application relates to and claims priority from Japanese Patent Application No. 2003-349701, filed on Oct. 8, 2003, the entire disclosure of which is incorporated herein by reference.

BACKGROUND OF THE INVENTION

1. Field of the Invention

The present invention relates to a liquid cooling jacket attached to a heating element in a liquid cooling system used for cooling an electronic device.

2. Description of the Related Art

Conventionally, a liquid cooling jacket used for cooling an electronic device must efficiently transmit heat from a heating element to coolant.

Figure 18:
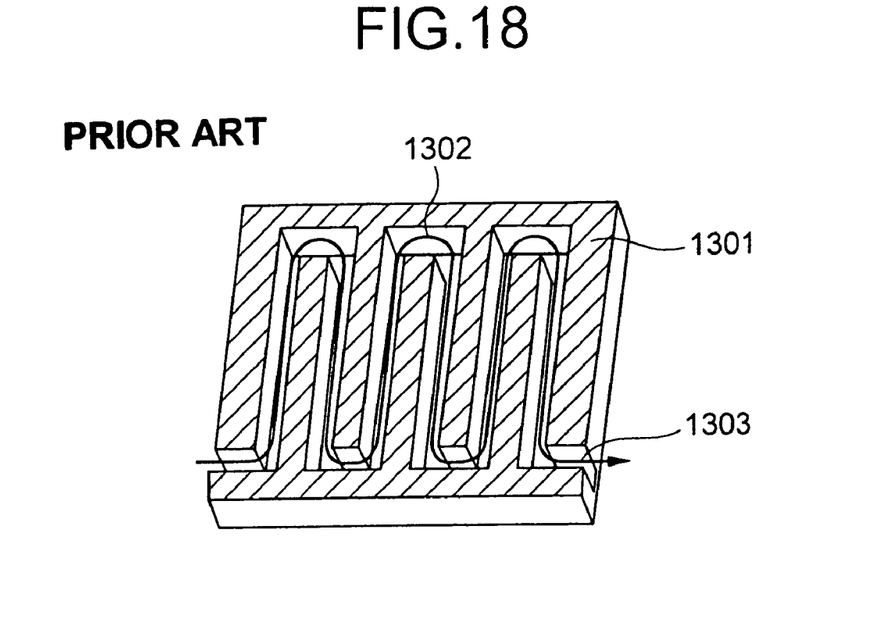
FIG. 18 is a view illustrating a conventional liquid cooling jacket having a meandering passage.

For this reason, as an example, a conventional liquid cooling jacket has therein a meandering passage, as illustrated in FIG. 18. In this example, the passage 1302 within the jacket 1301 meanders so that the flow 1303 of coolant is in contact with the jacket 1301 as long as possible. This is a method in which the contact area between the coolant and the inner surface of the jacket wall is increased by increasing the length of the passage within the jacket 1301 as much as possible to efficiently transmit heat from a heating element to the coolant.

Figure 19:
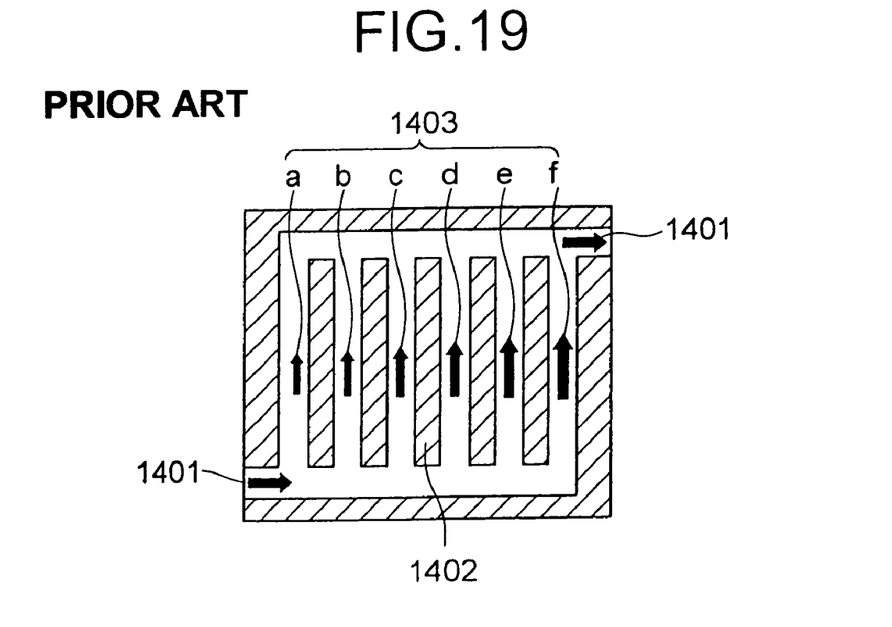
FIG. 19 is a view illustrating a conventional liquid cooling jacket having a plurality of passages.

In another example, as illustrated in FIG. 19, the flow 1401 of coolant is divided into a plurality of streams 1403a to 1403f. This is a method in which provision of a plurality of passage paths decreases the passage resistance and increases the contact area between the coolant and radiating fins 1402 to efficiently transmit heat (for example, see JP-A-2000-340727).

Figure 20:
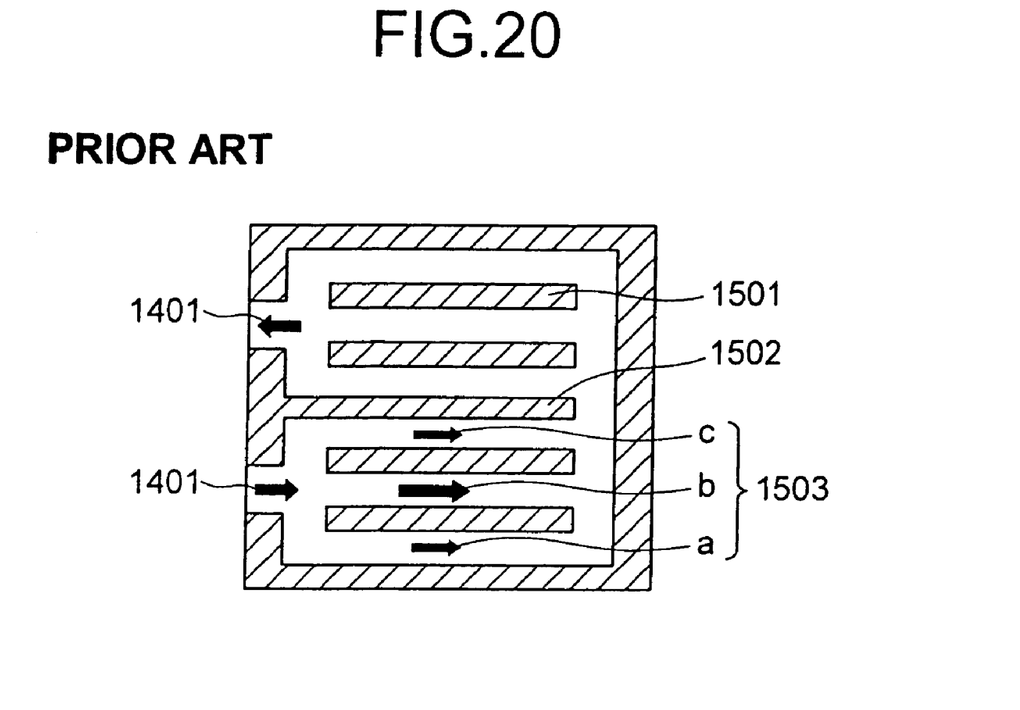
FIG. 20 is a view illustrating a conventional liquid cooling jacket having a turned-back passage.

In addition, because convenience of piping is superior if the inlet and outlet of coolant are in a row, a conventional liquid cooling jacket has the inlet and outlet of coolant arranged in a row. As illustrated in FIG. 20, this is a method in which a partition 1502 is provided at the center of the arrangement of radiating fins 1501 to turn back the flow 1401 of coolant and thereby the inlet and outlet are arranged in a row (for example, see JP-A-2002-170915).

However, the meandering passage as illustrated in FIG. 18 has a problem that the passage resistance increases as the length of the passage increases, and thus the pressure loss increases.

The passage in which the flow of coolant is divided into a plurality of steams, as illustrated in FIG. 19, has a problem that it is difficult to make the coolant flow evenly among the radiating fins. More specifically, because any liquid flow has straight motility, there is a problem that the coolant is hard to flow to the radiating fin near the inlet. Thus, as illustrated in FIG. 19, unevenness occurs in the flow rates of the streams 1403a to 1403f. As a result, the heat transfer coefficient decreases so that heat from the heating element cannot be efficiently transmitted to the coolant.

The structure as illustrated in FIG. 20 also has a problem that unevenness occurs in the liquid streams 1503a to 1503c between the radiating fins. More specifically, the flow rate of the stream 1503b near the inlet or outlet is the highest and the other flow rates of the streams 1503a and 1503c are lower. As a result, the heat transfer coefficient decreases so that heat from the heating element cannot be efficiently transmitted to the coolant.

Figure 21:
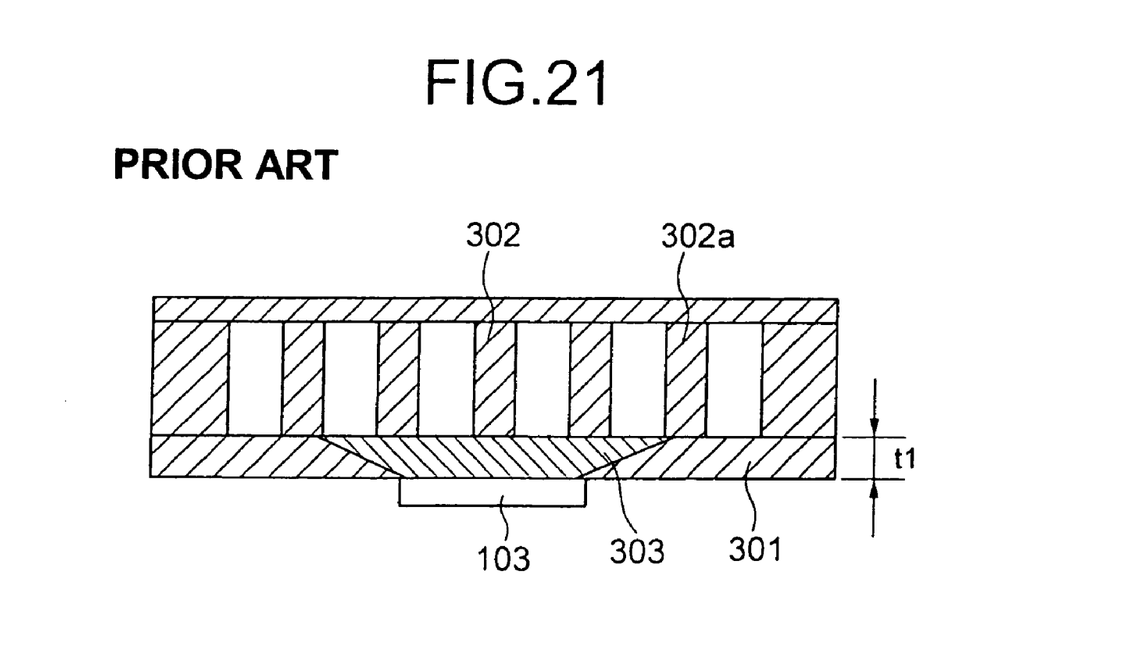
FIG. 21 is a view illustrating the manner of heat transmission in a conventional liquid cooling jacket.

In addition, any prior art as described above has a problem that improvement of coefficient of thermal conductivity is difficult even if the jacket size is increased in order to ensure more contact area, because the distance from the centered heating element increases. More specifically, conventionally, as illustrated in FIG. 21, a base 301 horizontally spreads heat to transmit the heat to each radiating fin 302. However, the base thickness t1 has a limit by the influence of weight and height. Actually, the thickness is about 7 mm at the maximum. Therefore, the spread 303 of heat is limited to the periphery of the heating element 103 and heat cannot be transmitted to the end radiating fins 302a. That is, as the jacket size increases, the cooling effect of the end radiating fins decreases.

BRIEF SUMMARY OF THE INVENTION

An object of the present invention is to provide a liquid cooling jacket good in heat transfer coefficient and superior in extensibility and assembling.

A liquid cooling jacket according to the present invention comprises a base bonded to a heating element; a post standing perpendicularly to the base; a plurality of radiating fins attached to the post and arranged so as to be parallel to the base; a partition filling up intervals between the plurality of radiating fins at a predetermined width; and a case which surrounds the post and the radiating fins and is bonded to the base, and to which an inlet and an outlet for coolant are attached at positions where flow of the coolant is divided by the partition. The plurality of radiating fins may be arranged at intervals each of which is narrow in comparison with a thickness of each of the plurality of radiating fins.

(1) According to the present invention, because the coolant flow within the liquid cooling jacket ensures a plurality of passages, the passage resistance is low. In addition, by setting the size of each of the inlet and outlet for the coolant to be substantially equal to the height of the arranged radiating fins, the flow rates between the radiating fins can be even.

(2) According to the present invention, because the post for transmitting heat to each radiating fin is thick and the height of the post can be at a small distance from the base in contact with the heating element, the coefficient of thermal conductivity is high.

(3) According to the present invention, because the route of the coolant is turned back by the partition provided between the radiating fins, the inlet and outlet for the coolant can be arranged in a row and thus convenience on piping is superior.

Other object, features and advantages of the invention will become apparent from the following description of the embodiments of the invention taken in conjunction with the accompanying drawings.

DETAILED DESCRIPTION OF THE INVENTION

Hereinafter, embodiments according to the present invention will be described in detail with reference to drawings. Through all drawings for explaining the embodiments, the same components are denoted as a rule by the same reference numerals, respectively, to omit the repetitious description.

Figure 1:
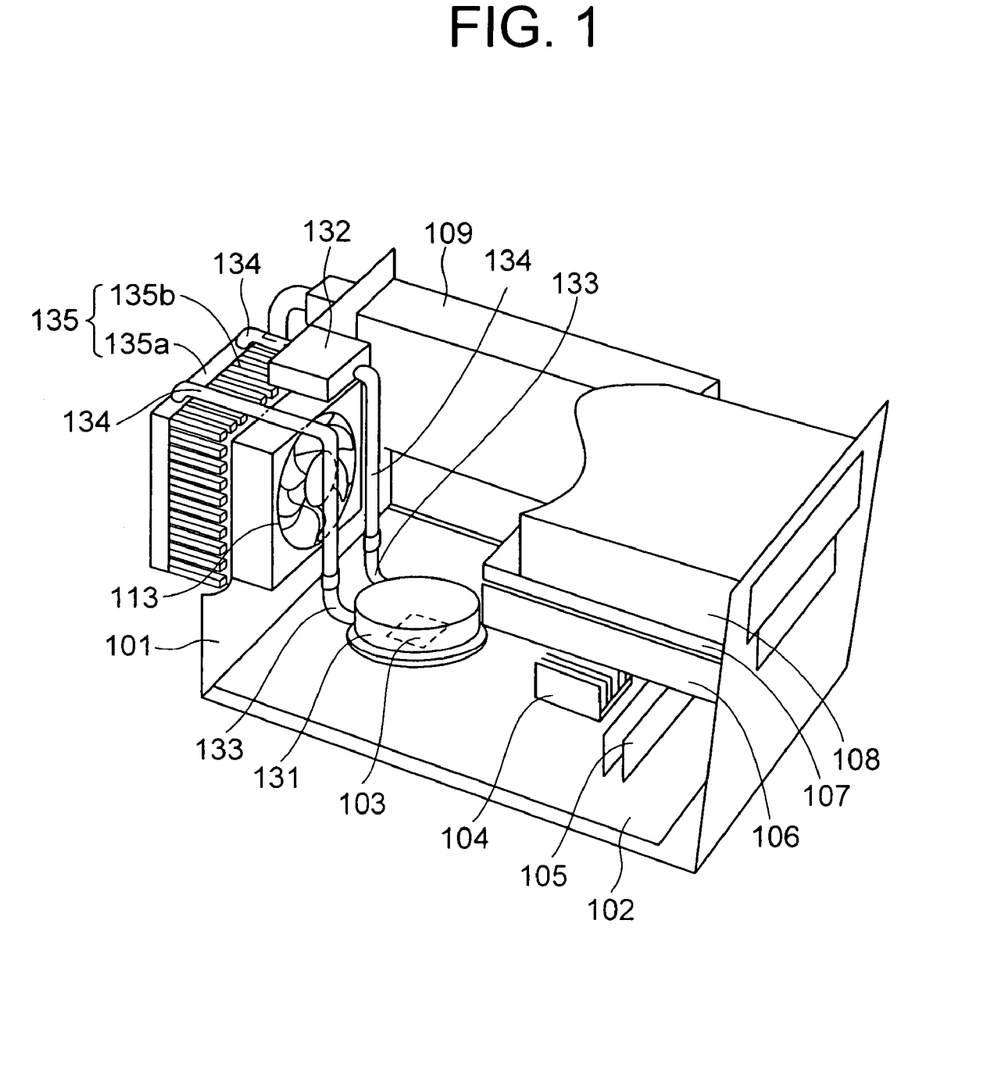
FIG. 1 is a perspective view of an electronic device to which a liquid cooling jacket according to the present invention is applied.

With reference to FIG. 1, the structure of an electronic device to which a liquid cooling jacket according to the present invention is applied will be described. FIG. 1 is a perspective view of the electronic device to which the liquid cooling jacket according to the present invention is applied.

As an example of the electronic device, FIG. 1 illustrates a desktop type personal computer.

In FIG. 1, a mother board 102 is near the bottom face within a casing 101. On the mother board 102 mounted are a CPU 103 as a heating element, a chip set 104, and a memory 105. An HDD 106, an FDD 107, and a CD-ROM drive 108 are installed as external storage devices within the casing 101. A liquid cooling jacket 131 according to the present invention is attached to the CPU 103.

This liquid cooling jacket 131 is made of metal superior in heat transfer, such as copper or aluminum.

The contact surface with the CPU 103 is bonded under pressure with thermal compound or highly heat-conductive silicone rubber being interposed, thereby a structure is realized in which heat generated in the CPU 103 is efficiently transmitted to the liquid cooling jacket 131. Coolant is made to flow within the liquid cooling jacket 131 by a pump 132 to realize a structure for transmitting heat to the coolant.

A heat sink 135 as a radiator unit is disposed outside the rear face of the casing 101. The heat sink 135 is made up of a base 135a and fins 135b. The coolant flows within the base 135a to realize a structure for transmitting the heat of the coolant to the whole of the base 135a. In addition, the base 135a has a mechanism for keeping a constant liquid quantity. That is, the base 135a also functions as a reserve tank for the coolant.

The fins 135b are arranged so as to face the rear face of the casing. That is, the wind from a fan 113 blows on the fins 135b.

The fan 113 attached to the rear face of the casing 101 is disposed so as to be opposite to the heat sink 135 and the wind from the fan 113 blows directly to the fins 135b. More specifically, the fan 113 is an axial fan whose suction side is near the inside of the casing 101 and whose discharge side is near the heat sink 135. A power supply 109 is adjacent to the fan 113.

Tubes 133 and metallic pipes 134 connect the liquid cooling jacket 131 and the heat sink 135 to each other. The tubes 133 and the metallic pipes 134 allow the coolant to flow therein and thus they form a heat transmission path between the liquid cooling jacket 131 and the heat sink 135.

The whole piping is mainly made of the metallic pipes 134 and the rubber tubes 133 are partially used. Because the tubes 133 can be bent, maintenance such as replacement of the CPU 103 is easy. That is, the liquid cooling jacket 131 can be detached from the CPU 103 without detaching the fan 113 and the heat sink 135. In addition, by using the metallic pipes 134 for the part of the piping other than the tubes 133, moisture permeation is suppressed.

The flowing route of the coolant is from the pump 132 through the liquid cooling jacket 131 and the heat sink 135 to the pump 132. Thus, in the direction of the coolant flow by the pump 132, the pump 132 sucks the coolant after passing through the heat sink 135 and discharges the coolant to the liquid cooling jacket 131. Therefore, the cooled coolant flows in the pump 132 and thereby the pump 132 is prevented from being heated.

Figure 2:
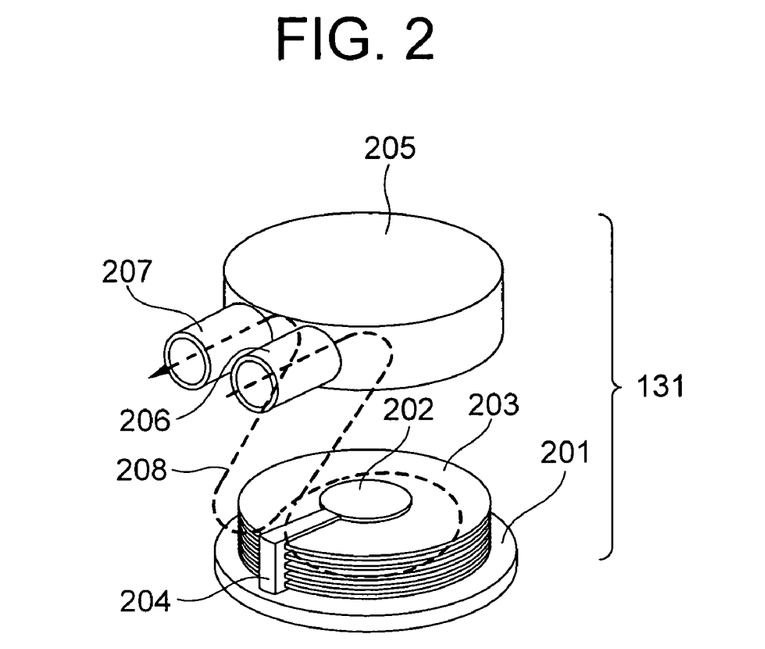
FIG. 2 is an exploded view of the liquid cooling jacket according to the present invention.
Figure 3:
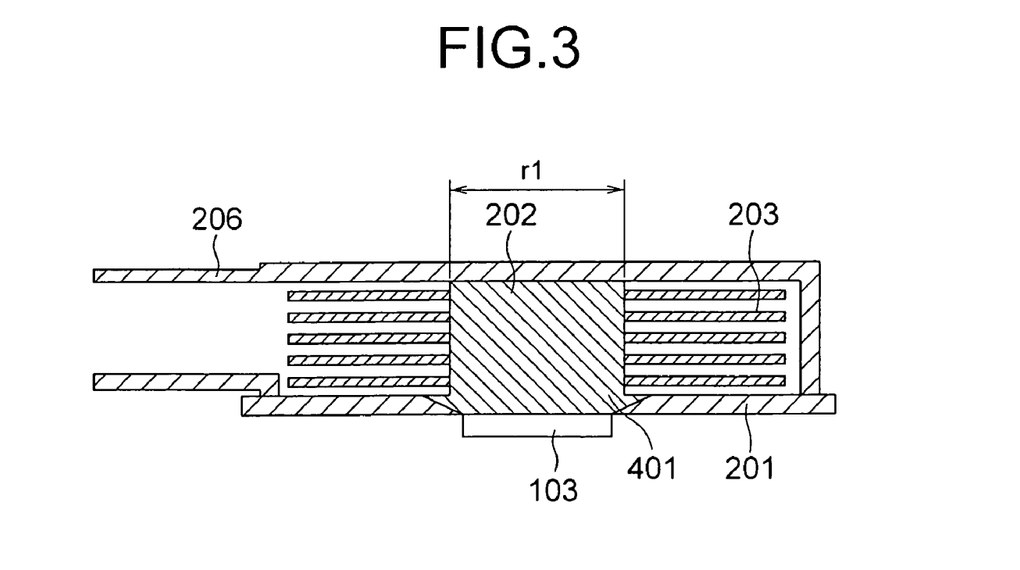
FIG. 3 is an explanatory view for explaining heat conduction to radiating fins of the liquid cooling jacket according to the present invention.
Figure 4:
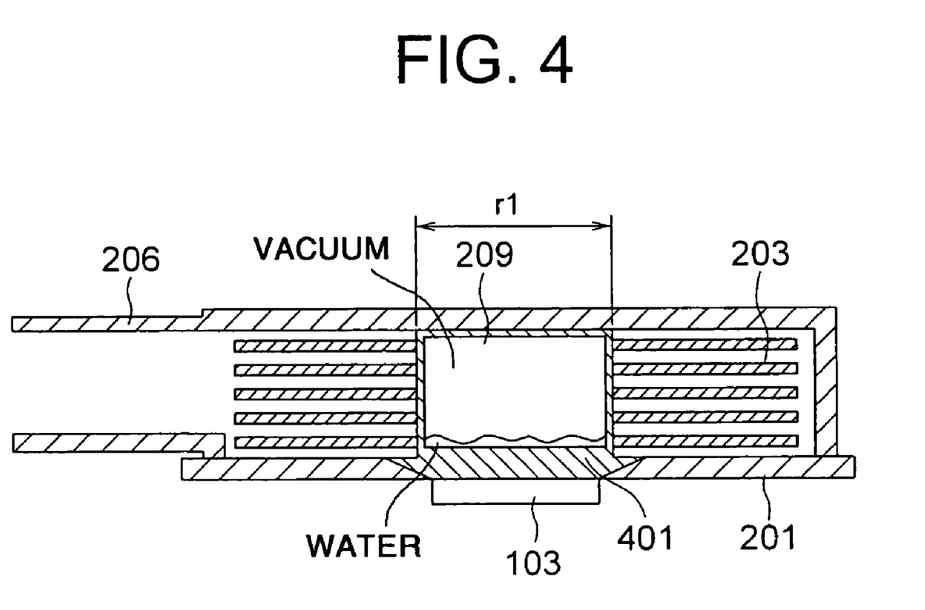
FIG. 4 is an explanatory view for explaining an example in which a heat pipe is used as a post of the liquid cooling jacket according to the present invention.

Next, with reference to FIGS. 2 to 7, the structure of the liquid cooling jacket according to the present invention will be described. FIG. 2 is an exploded view of the liquid cooling jacket according to the present invention. FIG. 3 is an explanatory view for explaining heat conduction to radiating fins of the liquid cooling jacket according to the present invention. FIG. 4 is an explanatory view for explaining an example in which a heat pipe is used as a post of the liquid cooling jacket according to the present invention.

Figure 5:
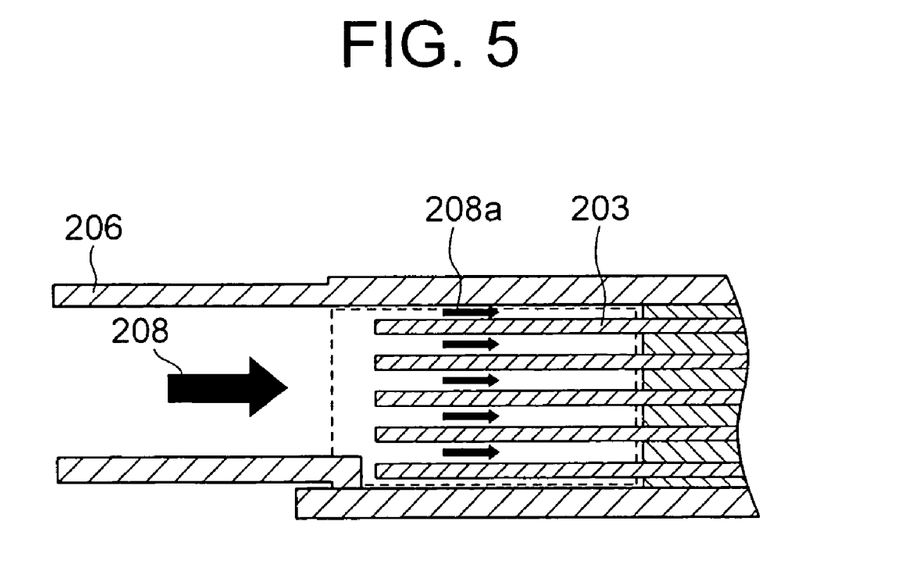
FIG. 5 is an explanatory view for explaining the flow of coolant of the liquid cooling jacket according to the present invention.
Figure 6:
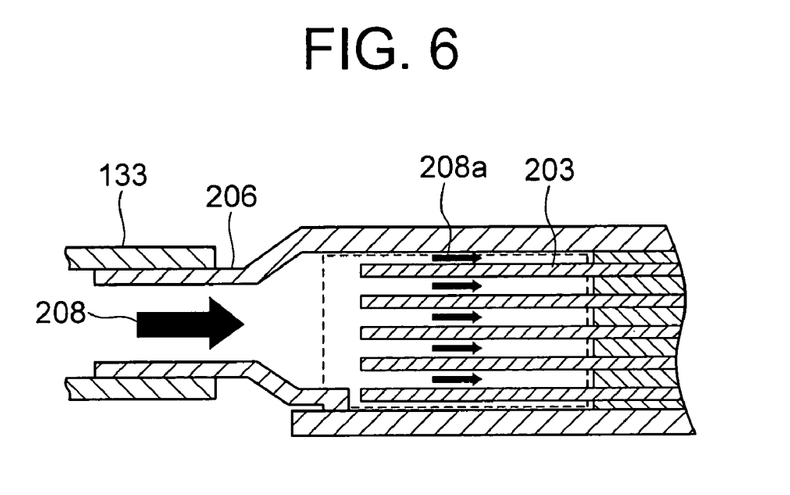
FIG. 6 is an explanatory view for explaining a shape for decreasing the diameter of an inlet or outlet of the liquid cooling jacket according to the present invention.
Figure 7:
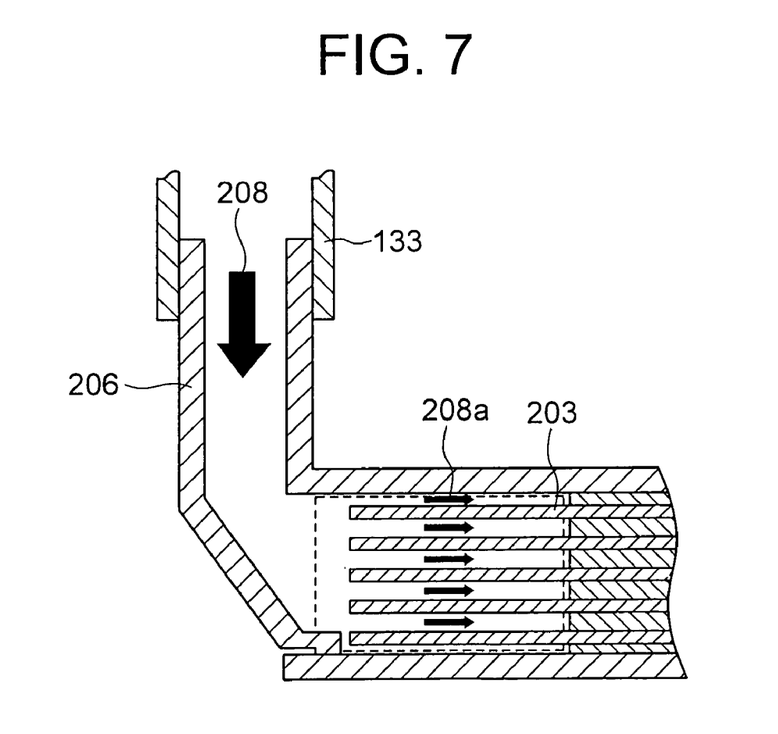
FIG. 7 is an explanatory view for explaining another shape for decreasing the diameter of the inlet or outlet of the liquid cooling jacket according to the present invention.

FIG. 5 is an explanatory view for explaining the flow of the coolant of the liquid cooling jacket according to the present invention. FIG. 6 is an explanatory view for explaining a shape for decreasing the diameter of an inlet or outlet of the liquid cooling jacket according to the present invention. FIG. 7 is an explanatory view for explaining another shape for decreasing the diameter of the inlet or outlet of the liquid cooling jacket according to the present invention.

First, components of the liquid cooling jacket will be described. As illustrated in FIG. 2, the liquid cooling jacket is made up of a base 201 bonded to the heating element 103, a post 202 standing vertically to the base 201, radiating fins 203 attached to the post 202 so as to be parallel to the base 201, a partition 204 filling up the intervals between the radiating fins at a predetermined width, and a case 205 that surrounds the post 202 and the radiating fins 203, is bonded to the base 201, and is provided with an inlet 206 and an outlet 207 for the coolant.

The base 201 is in contact with the heating element with high flatness. The base 201 has a function of keeping the post 202 vertical and a function of ensuring watertightness with the case 205. For efficiently transmitting heat to the post 202, a material high in heat conductivity, such as copper, may be used. The base 201 may be formed integrally with the post 202. Otherwise, a structure may be adopted in which the post 202 penetrates the base 201 to be in direct contact with the heating element 103. In this case, because the heat conductivity of the base 201 is not important, a cheap material can be used.

The post 202 vertically transmits heat from the heating element 103 and further transmits the heat to the radiating fins 203. In the related art, as described before, the base 201 horizontally spreads heat, as shown in the heat spread 303 in FIG. 21, to transmit heat to each radiating fin 302. However, the base thickness has a limit by the influence of weight and height. Actually, the thickness is about 7 mm at the maximum and thus the thermal resistance is high. Therefore, the heat spread 303 is limited to an area in the vicinity of the heating element 103 and heat cannot be transmitted to the end flat plates 302a.

Contrastingly, in this embodiment, as illustrated in FIG. 3, heat conduction to each radiating fin 203 is born by the post 202. This post 202 is columnar and thick as a diameter r1 of about 30 mm, and thus the thermal resistance is low. Further, even at the top portion of the post 202, sufficient cooling can be performed because the height of the post 202 is approximately equal to the height of the inlet 206 and outlet 207 for the coolant. For example, in case that the inlet 206 and outlet 207 each have an inner diameter of 7 φ mm and an outer diameter of 9 φ mm, the post 202 may have a height of about 10 mm. Because the distance from the heating element 103 is small, heat 401 from the heating element 103 can be sufficiently transmitted.

To further improve the cooling ability, as illustrated in FIG. 4, a heat pipe 209 may be used as the post 202. If the post 202 has a function of the heat pipe 209, a structure other than that illustrated in FIG. 4 is also possible.

The radiating fins 203 are attached to the post 202 in a positional relation of being parallel to the base 201. The radiating fins 203 each have a shape concentric with the post 202. The radiating fins 203 have a function of transmitting heat from the post 202 to the coolant. To further improve the heat transmissibility to the coolant, the surface of each radiating fin 203 may have protrusions, openings, or the like.

In this embodiment, the post 202 is columnar and the radiating fins 203 are concentric with the post 202. However, the shapes of the post 202 and radiating fins 203 are not limited to these. Other shapes may be adopted.

The radiating fins 203 of this embodiment must be designed differently from fins for air cooling. More specifically, air and liquid widely differs from each other in heat capacity. For example, the heat capacity of water is 89 times of that of air. That is, because the coolant as liquid is superior to air in ability of taking heat off, the fins can be small-sized in comparison with those for air cooling.

However, a noteworthy fact of fins for liquid cooling is that the temperature of each fin end is immediately lowered because heat is taken off by the coolant if the heat conductive ability of the fins is low. As a result, the temperature of each fin end remains low and heat is hard to be transmitted to the fin end. This decreases the cooling ability. That is, the fins for liquid cooling require high heat conductive ability.

More specifically, generally in case of radiating fins for air cooling, in many cases, each interval between the radiating fins is wide in comparison with the thickness of each radiating fin because a large amount of air is required for discharging heat. However, inversely in case of liquid cooling of this embodiment, each radiating fin is preferably thick to increase the heat conductive ability of the fin itself. In case of this embodiment, for water cooling, each interval between the radiating fins is narrow in comparison with the thickness of each radiating fin, for example, the thickness of each radiating fin 203 is 2 mm and each interval between the fins is 1 mm.

As illustrated in FIG. 2, the radiating fins are provided with a partition 204 filling up the intervals between the radiating fins at a predetermined width. This partition 204 is for forming a passage for the coolant 208 as illustrated in FIG. 2. Because the liquid flow is thereby turned back, the inlet 206 and the outlet 207 can be arranged parallel to each other. This can improve convenience on piping. If the liquid flow need not be turned back, the partition 204 may be omitted so that the inlet 206 and the outlet 207 are disposed in opposition to each other.

The inlet 206 and the outlet 207 have a function of making the coolant flow evenly among the intervals between the radiating fins. In this embodiment, as illustrated in FIG. 5, the size of each of the inlet 206 and outlet 207 is substantially equal to the height of the radiating fins 203. Thus, from the coolant 208 having entered the jacket, the coolant flows 208a flowing in the intervals between the radiating fins 203 can be even.

Here, if the diameter of the inlet 206 or outlet 207 is intended to be decreased for reasons of, e.g., the tube connected to the jacket, as illustrated in FIG. 6, the shape of the inlet 206 or outlet 207 may be tapered after the insertion portion of the tube 133. Otherwise, as illustrated in FIG. 7, the inlet 206 or outlet 207 may be disposed at an angle with the radiation fins 203 and the passage between the inlet 206 or outlet 207 and the radiation fins 203 is connected by an inclined wall.

Figure 8:
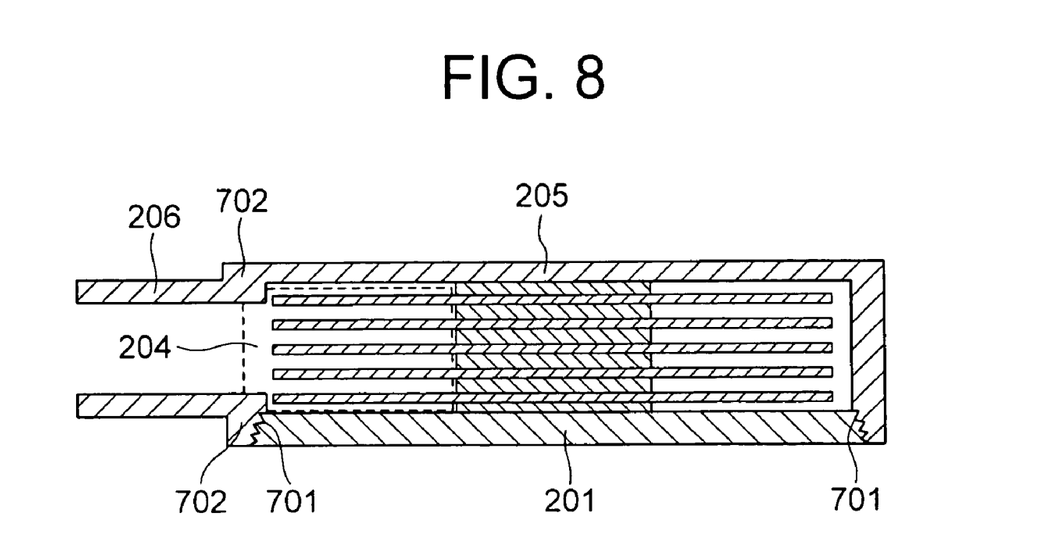
FIG. 8 is an explanatory view for explaining the structure of a liquid cooling jacket according to the present invention in consideration of assembling.
Figure 9:
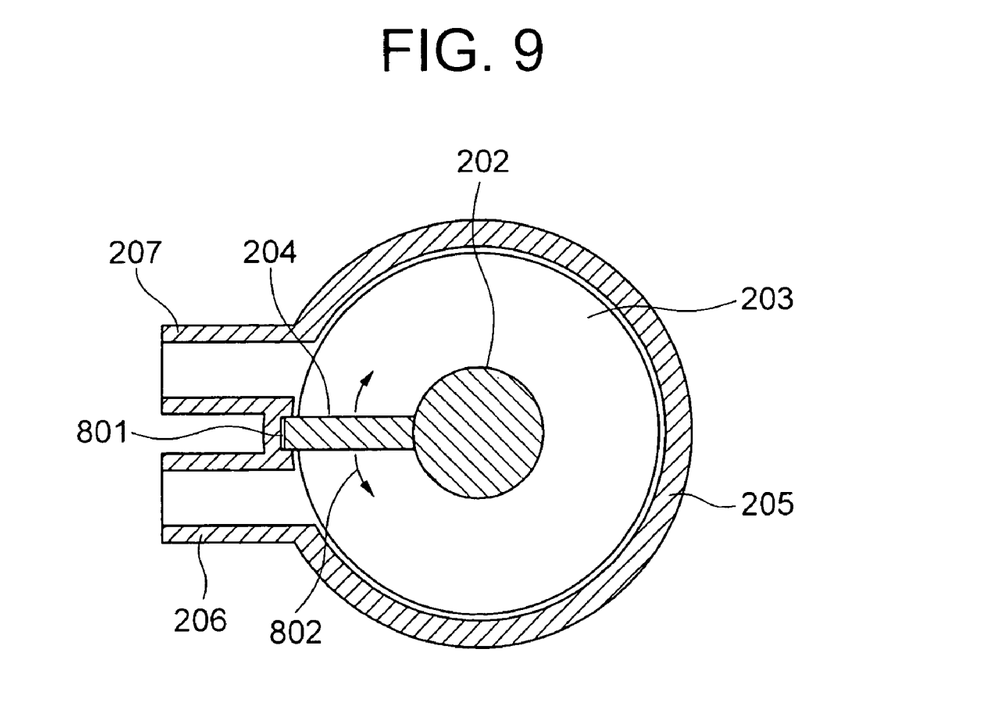
FIG. 9 is an explanatory view for explaining the structure of the liquid cooling jacket according to the present invention in consideration of assembling.
Figure 10:
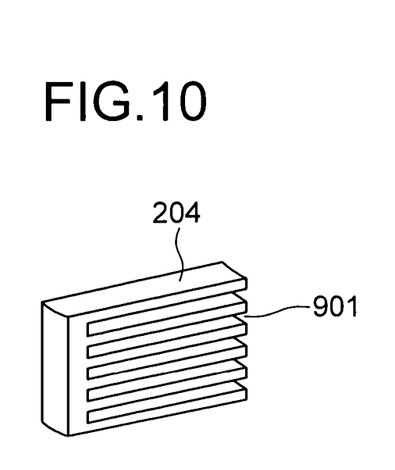
FIG. 10 is an explanatory view for explaining the shape of a partition of the liquid cooling jacket.

Next, with reference to FIGS. 8 to 10, an example of the liquid cooling jacket according to the present invention in consideration of assembling will be described. FIGS. 8 and 9 are explanatory views for explaining the structure of the liquid cooling jacket according to the present invention in consideration of assembling. FIG. 10 is an explanatory view for explaining the shape of the partition of the liquid cooling jacket according to the present invention.

As illustrated in FIG. 8, the base 201, the post 202, and the radiating fins 203 are integrally formed by rotary lathe processing. On the circumference of the edge of the base 201 has been formed a threaded portion 701 by being subjected to threading processing. On the other hand, the case 205 also has been subjected to the corresponding threading processing.

In the case 205, as illustrated in FIG. 9, a groove 801 in which the partition 204 is fitted is provided between the inlet 206 and outlet 207 for the coolant.

The partition 204 has the shape as illustrated in FIG. 10, which has grooves 901 to be fitted on the respective radiating fins 203. The partition 204 can slide as shown by arrows 802 in FIG. 9 in a state of being fitted on the radiating fins 203.

The coefficient of thermal expansion of the partition 204 may be set at a value different from that of the coefficient of thermal expansion of the radiating fins. This measure makes it possible that the partition groove 901 is processed such that the partition 204 and the radiating fins 203 can be easily moved upon assembling, and the partition groove is narrowed by heat of the coolant so that the partition 204 and the radiating fins 203 can be completely brought into close contact with each other upon actual cooling.

An assembling procedure of the liquid cooling jacket of this embodiment will be described. First, the partition 204 is fitted in the radiating fins 203. Next, the case 205 is put on the base 201 such that the partition 204 is fitted in the groove 801 at this time. Afterward, it suffices that the case 205 is rotated to be screwed in the base 201. At this time, by making the threaded portion 701 tapered, watertightness can be easily realized.

Next, with reference to FIGS. 11 to 17, other structures of liquid cooling jackets of this embodiment will be described.

Figure 11:
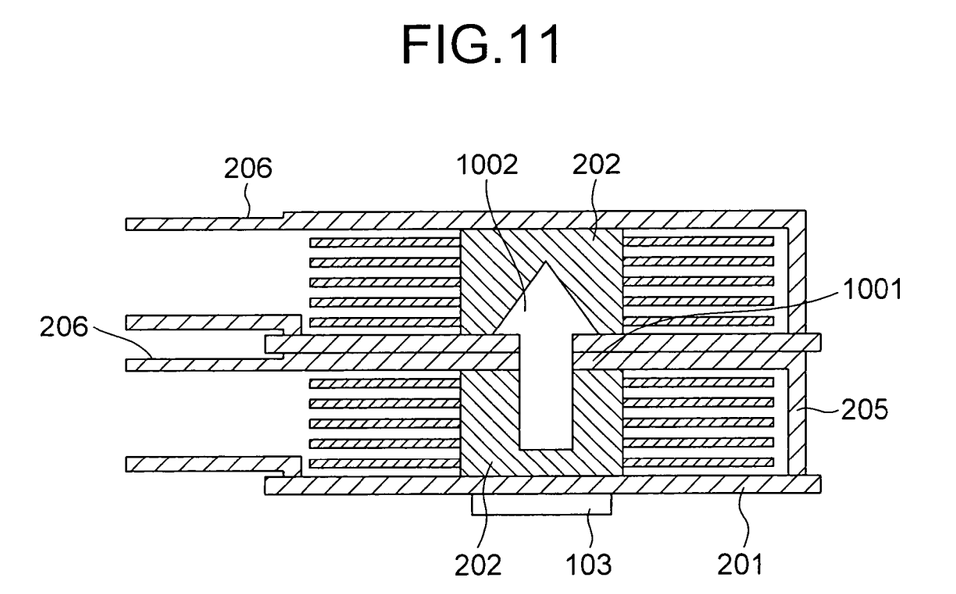
FIG. 11 is a view illustrating an example in which liquid cooling jackets according to the present invention are put in layers to further improve the performance.
Figure 12:
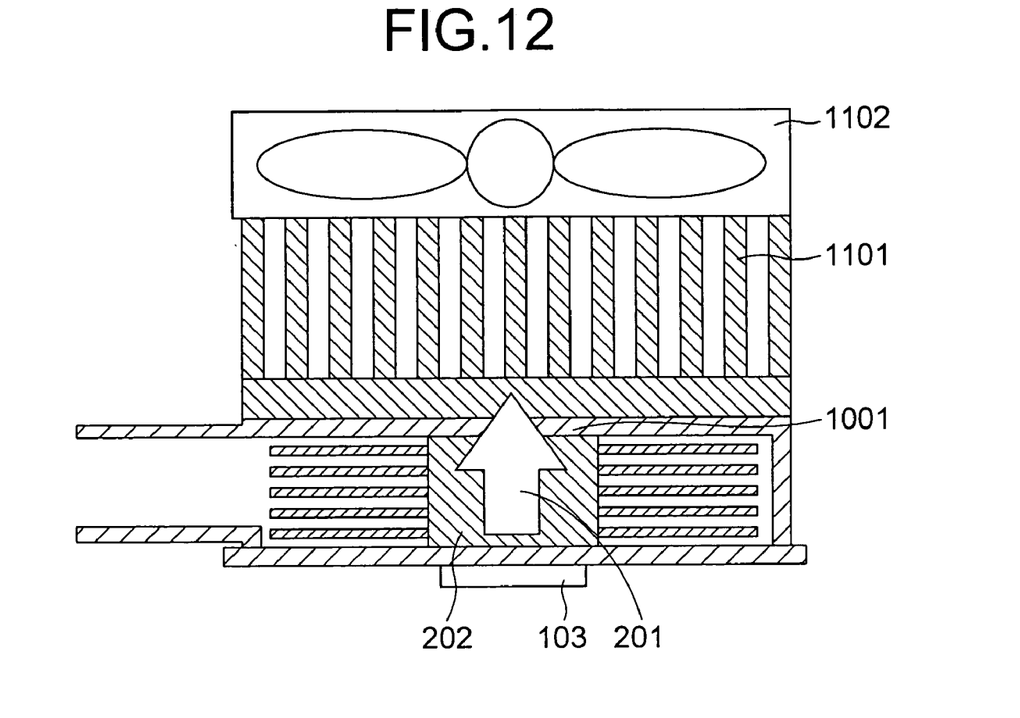
FIG. 12 is a view illustrating an example in which an air-cooling heat sink and a fan are put in layers on a liquid cooling jacket of the present invention to further improve the performance.
Figure 13:
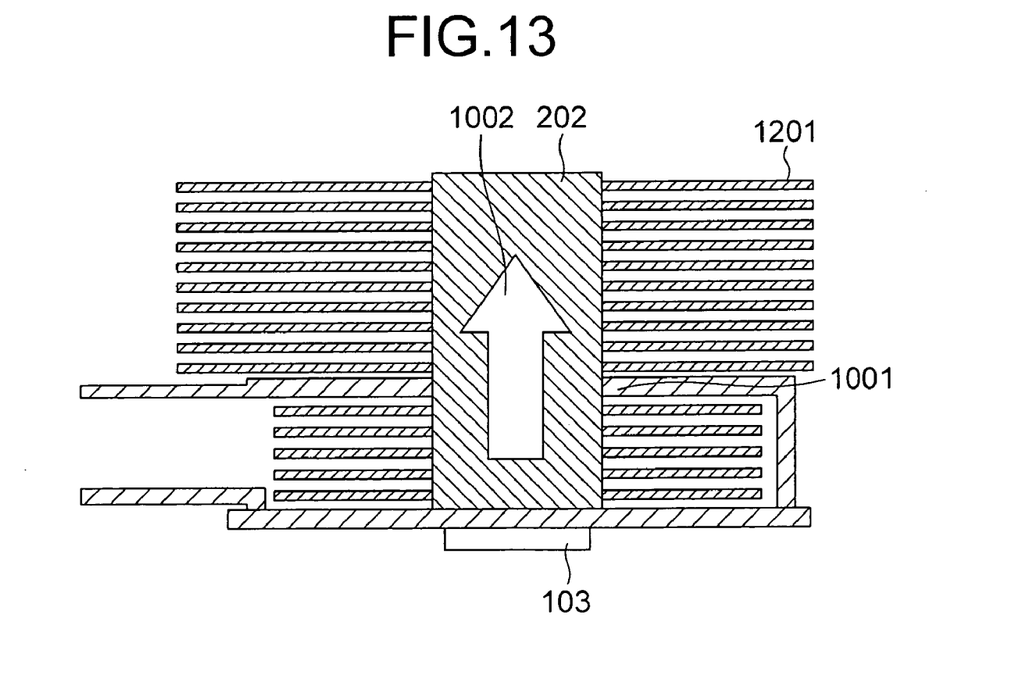
FIG. 13 is a view illustrating an example in which the performance is intended to be further improved by an air-cooling heat sink formed integrally with a liquid cooling jacket according to the present invention.
Figure 14:
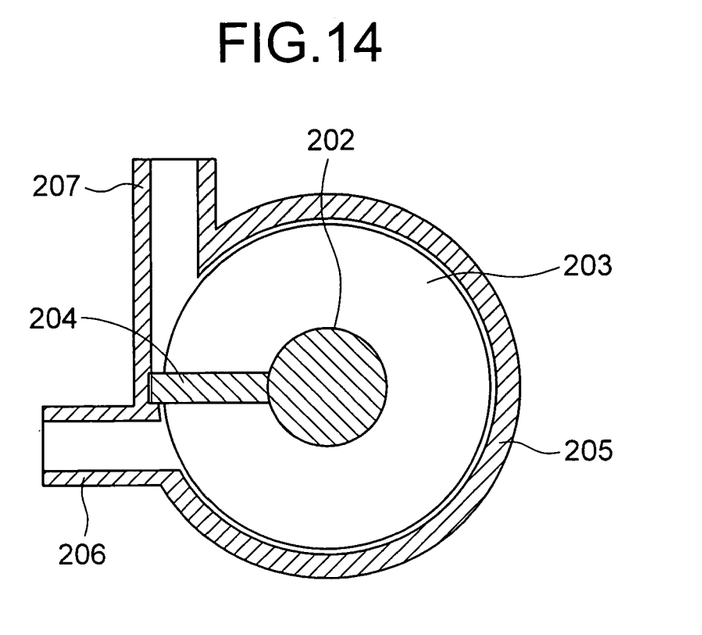
FIG. 14 is a view illustrating an example in which the arrangement of the inlet and outlet of a liquid cooling jacket according to the present invention is changed.
Figure 15:
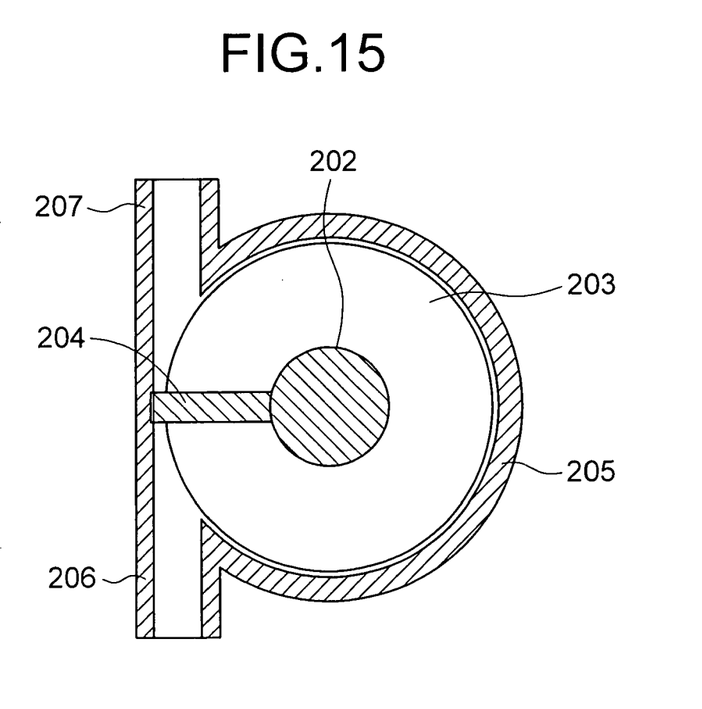
FIG. 15 is a view illustrating an example in which the arrangement of the inlet and outlet of a liquid cooling jacket according to the present invention is changed.
Figure 16:
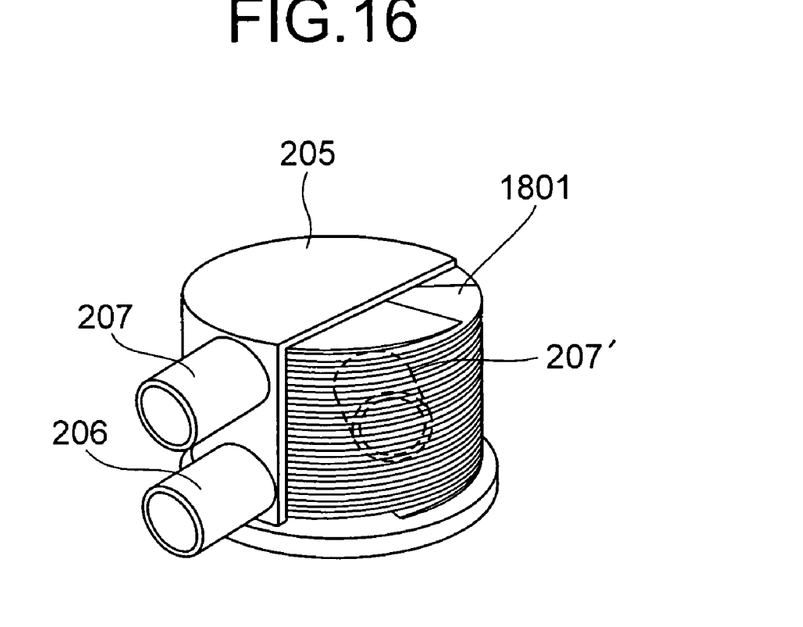
FIG. 16 is a view illustrating an example in which a spiral radiating fin is used in a liquid cooling jacket according to the present invention.
Figure 17:
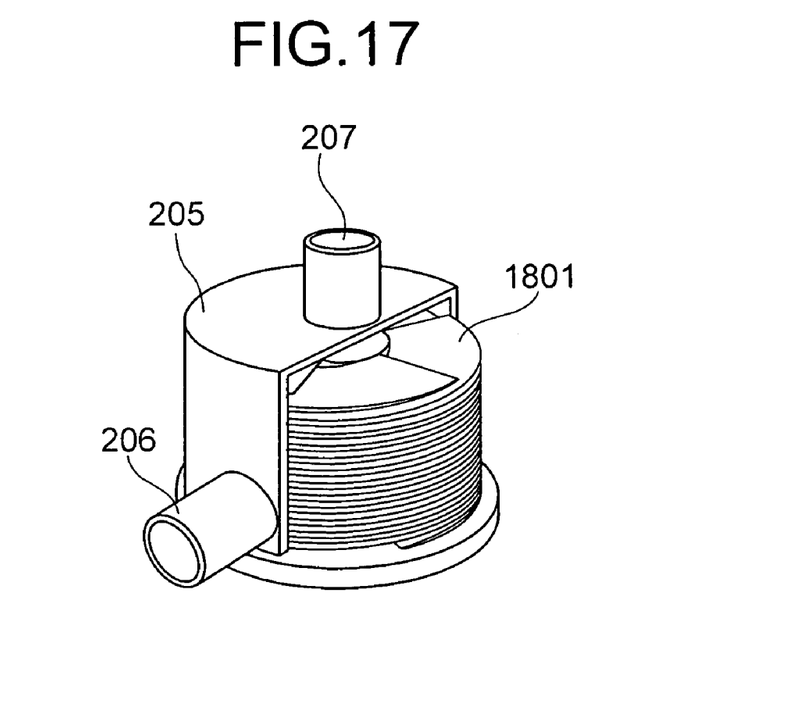
FIG. 17 is a view illustrating an example in which a spiral radiating fin is used in a liquid cooling jacket according to the present invention.

FIG. 11 is a view illustrating an example in which liquid cooling jackets according to the present invention are put in layers to further improve the performance. FIG. 12 is a view illustrating an example in which an air-cooling heat sink and a fan are put in layers on a liquid cooling jacket according to the present invention to further improve the performance. FIG. 13 is a view illustrating an example in which the performance is intended to be further improved by an air-cooling heat sink formed integrally with a liquid cooling jacket according to the present invention. FIGS. 14 and 15 are views illustrating examples in each of which the arrangement of the inlet and outlet of a liquid cooling jacket according to the present invention is changed. FIGS. 16 and 17 are views illustrating examples in each of which a spiral radiating fin is used in a liquid cooling jacket according to the present invention.

In liquid cooling jackets of this embodiment, because heat from the heating element is vertically conducted, as illustrated in FIG. 11, the heat transfer coefficient can be further improved by putting a liquid cooling jacket on another liquid cooling jacket. More specifically, the post 202 having received heat from the heating element 103 is in contact with a top plate 1001 of the case 205 and thus the former is thermally connected to the latter. Therefore, the heat from the heating element 103 is transmitted to the post 202 of the upper jacket as shown by an arrow 1002. Thus, because the heat from the heating element 103 is transmitted to the coolant by a plurality of jackets, the heat transfer coefficient is further improved.

In addition, by thermally connecting the post 202 to the top plate 1001 of the case 205, as illustrated in FIG. 12, the cooling ability can be intended to be further improved by attaching an air-cooling heat sink 1101 and a fan 1102.

Further, as illustrated in FIG. 13, the post 202 may penetrate the top plate 1001 to be formed integrally with an air-cooling heat sink 1201.

In addition, as for the directions of the inlet 206 and outlet 207 of the liquid cooling jacket, as illustrated in FIGS. 14 and 15, the direction of one or both of the inlet and outlet can be changed.

In addition, by using a spiral radiating fin, the coolant can be turned without using the partition 204.

In this measure, as illustrated in FIGS. 16 and 17, by using a spiral radiating fin 1801, the coolant having entered from the inlet 206 is made to spirally flow and discharged from the upper outlet 207. In case of this embodiment, the position of the outlet 207 suffices if it is in the upper portion of the case 205. For example, the outlet 207 may be at a position denoted by a reference numeral 207' shown in FIG. 16, or may be on the top face of the case 205 as illustrated in FIG. 17.

As described above, in this embodiment, the liquid cooling jacket comprises a base 201 bonded to a heating element 103, a post 202 standing vertically to the base 201, a plurality of radiating fins 203 attached to the post 202 and arranged so as to be parallel to the base 201, a partition 204 filling up the intervals between the plurality of radiating fins 203 at a predetermined width, and a case 205 which surrounds the post 202 and the radiating fins 203 and is bonded to the base 201 and to which an inlet 206 and an outlet 207 are attached at positions symmetrical in relation to the partition 204. The plurality of radiating fins 203 are arranged at the intervals each of which is narrow in comparison with the thickness of each radiating fin 203. Therefore, because the coolant flow within the liquid cooling jacket ensures a plurality of passages, the passage resistance is low. In addition, by setting the size of each of the inlet and outlet for the coolant to be substantially equal to the height of the arranged radiating fins 203, the flow rates on the radiating fins 203 can be even.

In addition, because the post 202 for transmitting heat to each radiating fin 203 is thick and the height of the post 202 can be at a small distance from the base 201 in contact with the heating element 103, the coefficient of thermal conductivity is high.

In addition, because the route of the coolant is turned back by the partition 204 provided between the radiating fins 203, the inlet and outlet for the coolant can be arranged in a row and thus convenience on piping is superior.

It should be further understood by those skilled in the art that the foregoing description has been made on embodiments of the invention and that various changes and modifications may be made in the invention without departing from the spirit of the invention and the scope of the appended claims.

What is claimed is:

1. A liquid cooling jacket, comprising:
    a base bonded to a heating element;
    a post standing perpendicularly to said base;
    a plurality of radiating fins attached to said post and arranged at a distance so as to be parallel to said base;
    a case which surrounds said post and said radiating fins and which is bonded to said base, and to which an inlet and an outlet for coolant are attached in a peripheral direction; and
    a single radial partition filling intervals between said plurality of radiating fins radially from said post to said case, so as to separate said inlet and said outlet for coolant,
    wherein said partition defines an end portion of a coolant passage defined by said base, said radiating fins, said case, and said post.

2. The liquid cooling jacket according to claim 1, wherein said post is columnar, and said radiating fins are concentric with said post.

3. The liquid cooling jacket according to claim 1, wherein said post is in contact with a top face of said case to transmit heat of said post to said top face.

4. The liquid cooling jacket according to claim 2, wherein said post is in contact with a top face of said case to transmit heat of said post to said top face.

5. The liquid cooling jacket according to claim 3, wherein an air-cooling heat sink is attached to the top face of said case.

6. The liquid cooling jacket according to claim 4, wherein an air-cooling heat sink is attached to the top face of said case.

7. The liquid cooling jacket according to claim 1, wherein said post has a function of a heat pipe.

8. The liquid cooling jacket according to claim 2, wherein said post has a function of a heat pipe.

9. The liquid cooling jacket according to claim 3, wherein said post has a function of a heat pipe.

10. The liquid cooling jacket according to claim 4, wherein said post has a function of a heat pipe.

11. The liquid cooling jacket according to claim 5, wherein said post has a function of a heat pipe.

12. The liquid cooling jacket according to claim 6, wherein said post has a function of a heat pipe.

13. A liquid cooling jacket, comprising:

a base bonded to a heating element;

a post standing perpendicularly to said base;

a radiating fin attached to said post to define a spiral passage; and a case which surrounds said post and said radiating fin and which is bonded to said base, and to which an inlet and an outlet for coolant are attached on upper and lower sides in a direction perpendicular to said base.

14. The liquid cooling jacket according to claim 13, wherein said post is columnar, and said radiating fin is concentric with said post.

15. The liquid cooling jacket according to claim 13, wherein said post has a function of a heat pipe.

* * * * *